(12) United States Patent
Varesi

(10) Patent No.: US 8,530,874 B1
(45) Date of Patent: Sep. 10, 2013

(54) INSULATED PHASE CHANGE MEMORY

(75) Inventor: Enrico Varesi, Milan (IT)

(73) Assignee: Micron Technology, Inc., Boise, ID (US)

( * ) Notice: Subject to any disclaimer, the term of this patent is extended or adjusted under 35 U.S.C. 154(b) by 262 days.

(21) Appl. No.: 12/828,463

(22) Filed: Jul. 1, 2010

(51) Int. Cl.
*H01L 29/02* (2006.01)
(52) U.S. Cl.
USPC ..... 257/2; 257/3; 257/4; 257/5; 257/E29.002; 438/102; 438/103; 438/104
(58) Field of Classification Search
USPC ............... 257/2–5, E29.002; 438/102–104
See application file for complete search history.

(56) References Cited

U.S. PATENT DOCUMENTS

| 2008/0048169 A1* | 2/2008 | Doyle et al. ............ 257/4 |
| 2009/0159867 A1* | 6/2009 | Savransky et al. ........ 257/3 |

* cited by examiner

*Primary Examiner* — Jami M Valentine
(74) *Attorney, Agent, or Firm* — Dorsey & Whitney LLP

(57) ABSTRACT

A phase change memory may include a plurality of thin layers covering a stack including a chalcogenide and a heater. The thin layers may form a barrier to heat loss. The thin layers may be the same or different materials. The layers may also be chemically or morphologically altered to improve the adverse affect of the interface between the layers on heat transfer.

19 Claims, 2 Drawing Sheets

INSULATED PHASE CHANGE MEMORY

BACKGROUND

This relates generally to phase change memories.

Phase change memory devices use phase change materials, i.e., materials that may be electrically switched between a generally amorphous and a generally crystalline state, for electronic memory application. One type of memory element utilizes a phase change material that may be, in one application, electrically switched between a structural state of generally amorphous and generally crystalline local order or between different detectable states of local order across the entire spectrum between completely amorphous and completely crystalline states. The state of the phase change materials is also non-volatile in that, when set in either a crystalline, semi-crystalline, amorphous, or semi-amorphous state representing a resistance value, that value is retained until changed by another programming event.

DETAILED DESCRIPTION

In accordance with some embodiments, a phase change memory cell may be encased within two or more thin layers of dielectric material. The thermal insulating effectiveness of these insulating layers is enhanced by using multiple, thin layers of dielectric material. Moreover, to reduce thermal cross talk between adjacent cells, the multiple layers of dielectric material are placed completely around both the heater and the phase change material in some embodiments.

Figure 1:
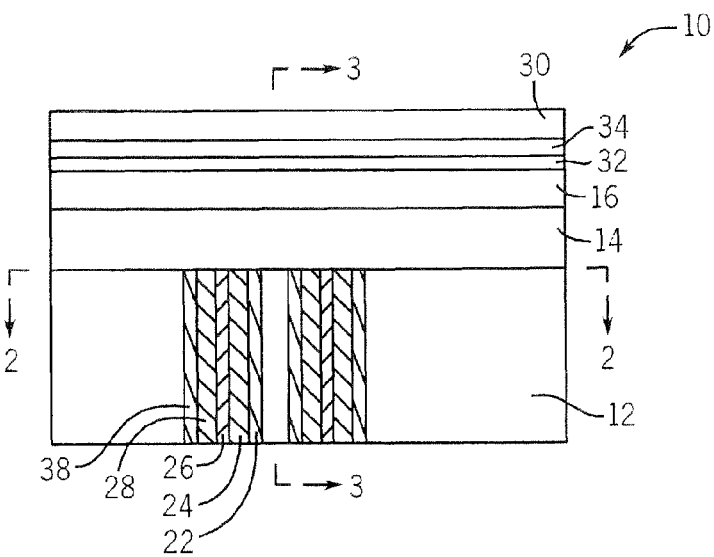
FIG. 1 is an enlarged, cross-sectional view in accordance with one embodiment of the present invention.

Referring to FIG. 1, a so-called wall architecture phase change memory is illustrated. While the ensuing description describes wall and pillar architectures, the present invention is not limited to any particular architecture. That is, the wall architecture is only one example and the present invention applies to any other architecture, including planar architectures where both the heater and the phase change memory are insulated using multiple dielectric layers.

In accordance with some embodiments, the insulating effectiveness of the dielectric may be enhanced by using thinner layers and more of them. Thus, the more layers that are used, the better the insulating characteristics because the effect of the interface is to increase the insulating effectiveness. Thus, interfaces can be made between materials of the same composition, as one example. In such case, the dielectric deposition or formation process may be stopped for long enough that a discrete interface is formed between layers. As another example, the interface may be formed of layers of different materials.

As still other examples, the interface may be formed or enhanced using chemical techniques. For example, a flash oxidation technique may be used between dielectric depositions to form a chemical difference at the interface, particularly in the case of non-oxide based dielectrics. In those cases, the interface is both chemical in terms of oxide versus non-oxide and chemical in the sense that a different type of bond is formed by the oxidation or nitridation, to mention two examples at the interface.

In addition, different types of gases may be applied at the interface. For example, silane, diborane gases may be applied to the surface in order to alter the surface. As another example, hydrogen gas may be applied to a dielectric surface to alter the surface and to improve its insulating capability.

Another class of interface modifications involve morphological modifications. For example, plasma etching of just deposited dielectrics may improve their thermal insulation capabilities because of the morphological changes at the interface. In addition, the interfaces may be bombarded or implanted. The implanted species may affect the interface, as may damage caused by the implant or bombardment.

An "interfacial insulator" includes at least two dielectric layers, each layer of a thickness less than 20 Angstroms in face-to-face contact with one another. A "common" interface as used herein is an interface between two materials that are chemically the same. A "disparate" interface is an interface between different materials. An "enhanced" interface is an interface that has been enhanced chemically or morphologically.

In general, the thinner the dielectric layers, the more layers that can be achieved and the higher the insulating capability. Thus, in some embodiments, very thin layers on the order of one or two nanometers may be utilized. In advantageous embodiments, thicknesses of less than 10 nanometers are utilized. Generally, techniques applicable to depositing thin layers are advantageous. Particularly advantageous, in some embodiments, is atomic layer deposition. However, chemical vapor deposition may also be used in some embodiments.

While the ensuing discussion describes a cell which includes only one chalcogenide layer, cells with multiple layers, including those using ovonic threshold switch selectors, may also be utilized. In some embodiments, the selector, such as the ovonic threshold switch, may also be covered by multiple dielectric layers to enhance the thermal insulating capabilities of the overall cell.

Referring to FIG. 1, a pair of cells may be formed over a semiconductor substrate, as indicated at 10. Each cell may be associated with a heater 26. The heater 26 may be encased within multiple dielectric layers 22, 24, 28, and 38 that form an interfacial insulator on each side of heater 26. While only two layers are shown in FIG. 1 on each side of heater 26, more layers may be utilized in some embodiments. In addition, the dielectric layers 22 and 24 are encased within a surrounding dielectric layer 12. Thus, interfaces may be formed between the layers 22 and 24 and between the layers 22 and 12. These interfaces may be any of the types of interfaces already described, including common, disparate or enhanced interfaces.

In contact with the heaters 26 is a phase change memory layer 14. Conventionally, the phase change memory layer 14 may be formed of a chalcogenide, such as germanium, antimony, tellurium, or GST. But any phase change material may be utilized. Over the phase change layer 14 may be a top electrode 16 which conventionally is a metal. Overlying the metal 16 is another encasing set of dielectric layers 32 and 34. The layers 32 and 34 may be made relatively thin, creating an interface between them to reduce upward or outward heat loss. Over layers 32 and 34 may be still another dielectric layer 30 which may form another interface between the layers 30 and 34.

Figure 2:
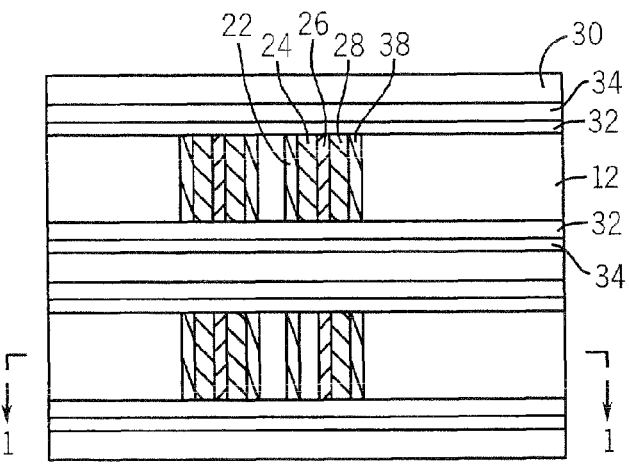
FIG. 2 is a cross-sectional view taken generally along the line 2-2 in FIG. 1.

Thus, referring to FIG. 2, a set of four heaters 26 are each encased by dielectric layers 22, 24, 28, and 38 in one direction, left-to-right, across the page. The heaters are also encased within another set of dielectric layers 32 and 34 which define an interface between them. The dielectric layer 12 forms an interface between the layer 32 as well. Thus, in some embodiments, the insulator 12 may be deposited, appropriate trenches formed, and the trenches filled or covered with the dielectric layers 22, 24, 28, 38, 32, and 34, as well as the heater layer 26 in the conventional wall architecture.

Figure 3:
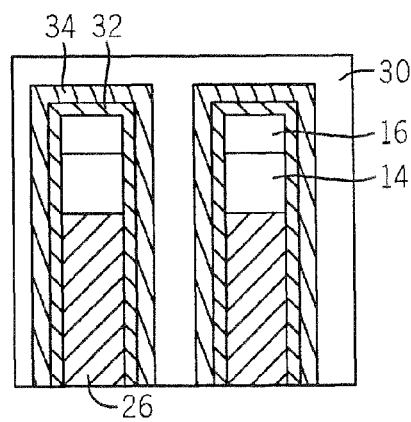
FIG. 3 is a cross-sectional view taken generally along the line 3-3 in FIG. 1.

After forming the wall heater structure shown in FIG. 1, the additional layers may be built up on top of a planarized top surface, corresponding to the plane "2" of FIG. 1. Namely, the phase change material layer 14 and the metal layer 16 may be formed and etched and then covered by the dielectric layers 32 and 34, as shown in FIG. 3. Then the entire structure may be covered by still another dielectric layer 30, forming interfaces between the layers 32 and 34 and the layers 34 and 30. Again, any of the types of interface already described may be utilized, in some embodiments. In one embodiment, each cell has a cell size of less than 50 nanometers.

The net effect is that the entire phase change memory cell is encased within an interfacial insulator. That is, both the heater and the phase change memory material, as well as its overlying conductor or top electrode 16, are all covered by a multilayer dielectric interfacial insulator. This may reduce heat loss and save power consumption in some embodiments. Of course, electrical contacts must be formed through the dielectric layer 30 and the layers 32 and 34, in some embodiments.

Moreover, thermal crosstalk between adjacent bits may be reduced by using an interfacial insulator around the chalcogenide used to form the memory element of each cell. This is especially true with a cell size (i.e. maximum cell dimension, e.g. length, width, or diameter) of less than 50 nanometers.

Programming to alter the state or phase of the material may be accomplished by applying voltage potentials to the electrodes 16 and heaters 26, thereby generating a voltage potential across a memory element including a phase change material 14. When the voltage potential is greater than the threshold voltages of any select device and memory element, then an electrical current may flow through the phase change material 14 in response to the applied voltage potentials, and may result in heating of the phase change material 14.

This heating may alter the memory state or phase of the material 14, in one embodiment. Altering the phase or state of the material 14 may alter the electrical characteristic of memory material, e.g., the resistance or threshold voltage of the material may be altered by altering the phase of the memory material. Memory material may also be referred to as a programmable resistance material.

In the "reset" state, memory material may be in an amorphous or semi-amorphous state and in the "set" state, memory material may be in a crystalline or semi-crystalline state. The resistance of memory material in the amorphous or semi-amorphous state may be greater than the resistance of memory material in the crystalline or semi-crystalline state. It is to be appreciated that the association of reset and set with amorphous and crystalline states, respectively, is a convention and that at least an opposite convention may be adopted.

Using electrical current, memory material may be heated to a relatively higher temperature to melt and then quenched to vitrify and "reset" memory material in an amorphous state (e.g., program memory material to a logic "0" value). Heating the volume of memory material to a relatively lower crystallization temperature may crystallize or devitrify memory material and "set" memory material (e.g., program memory material to a logic "1" value). Various resistances of memory material may be achieved to store information by varying the amount of current flow and duration through the volume of memory material.

One or more MOS or bipolar transistors or one or more diodes (either MOS or bipolar) may be used as the select device. If a diode is used, the bit may be selected by lowering the row line from a higher deselect level. As a further non-limiting example, if an n-channel MOS transistor is used as a select device with its source, for example, at ground, the row line may be raised to select the memory element connected between the drain of the MOS transistor and the column line. When a single MOS or single bipolar transistor is used as the select device, a control voltage level may be used on a "row line" to turn the select device on and off to access the memory element.

Figure 4:
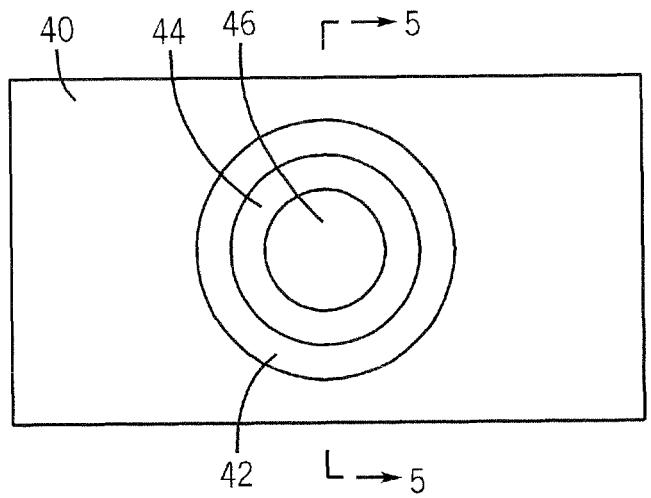
FIG. 4 is an enlarged, top plan view of another embodiment.
Figure 5:
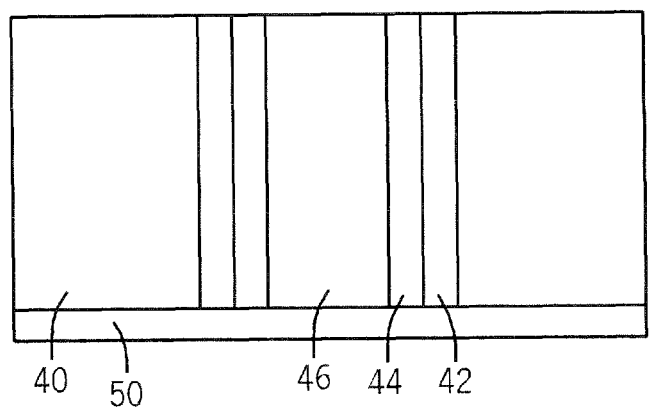
FIG. 5 is an enlarged, cross-sectional view taken generally along the line 5-5 in FIG. 4.

Referring to FIG. 4, in accordance with a pillar embodiment, an aperture may be formed within a dielectric 40. Within that dielectric 40 may be a first cylindrical dielectric 42 and a second cylindrical dielectric 44, together forming an interfacial insulator, surrounding a central phase change or chalcogenide material 46. The dielectric layers 42 and 44 may be deposited into a lithographically formed hole in the dielectric 40 and then planarized at the top and etched back at the bottom to open up a contact to an electrode 50, situated underneath the dielectric 40.

The phase change material 46 that fills the sub-lithographic hole defined by the electric layers 42 and 44 may be filled using chemical vapor deposition, metal organic chemical vapor deposition, or atomic layer deposition, to mention a few examples.

References throughout this specification to "one embodiment" or "an embodiment" mean that a particular feature, structure, or characteristic described in connection with the embodiment is included in at least one implementation encompassed within the present invention. Thus, appearances of the phrase "one embodiment" or "in an embodiment" are not necessarily referring to the same embodiment. Furthermore, the particular features, structures, or characteristics may be instituted in other suitable forms other than the particular embodiment illustrated and all such forms may be encompassed within the claims of the present application.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. A phase change memory comprising:
    a chalcogenide;
    a heater positioned to heat the chalcogenide; and
    an electrode in electrical contact with the chalcogenide, wherein the heater, chalcogenide, and electrode form a stack; and
    an interfacial insulator encasing said stack, wherein the interfacial insulator includes a first dielectric layer encasing the chalcogenide, the heater, and the electrode, and a second dielectric layer encasing the first dielectric layer, the chalcogenide, the heater, and the electrode, wherein the first dielectric layer comprises at least one of a chemically altered surface or a morphologically altered surface in contact with the second dielectric layer.

2. The memory of claim 1 wherein said first and second dielectric layers are less than 20 Angstroms thick.

3. The memory of claim 2 wherein said dielectric layers are different materials.

4. The memory of claim 1 wherein said interfacial insulator covers the stack on three sides.

5. A method comprising:
forming an interfacial insulator around a stack including a chalcogenide material, a heater, and an electrode, wherein the interfacial insulator comprises a first dielectric layer encasing the stack and a second dielectric layer encasing the first dielectric layer, wherein forming the interfacial insulator comprises altering a surface of the first dielectric layer.

6. The method of claim 5 including said dielectric layers have a thickness less than 20 nanometers and are in face-to-face contact with one another.

7. The method of claim 6 including forming said dielectric layers of different materials.

8. The method of claim 5, wherein altering the surface of the first dielectric layer comprises morphologically altering the surface of the first dielectric layer.

9. The method of claim 5, wherein altering the surface of the first dielectric layer comprises chemically altering the surface of the first dielectric layer.

10. The method of claim 5 wherein said forming the interfacial insulator comprises covering said stack on three sides with said interfacial insulator.

11. A phase change memory comprising:
at least two memory cells, a memory cell of the at least two memory cells including a chalcogenide material, a heater, and an electrode; and
interfacial insulators encasing respective memory cells of the at lest two memory cells, an interfacial insulator of the interfacial insulators comprising a first dielectric layer encasing the respective memory cells and a second dielectric layer encasing the first dielectric layer and the respective memory cells, wherein the first dielectric layer comprises at least one of a chemically altered surface or a morphologically altered surface in contact with the second dielectric later.

12. The memory of claim 11 wherein said encasing comprises covering said cell on at least three sides.

13. A phase change memory comprising:
at least two memory cells, a memory cell of the at least two memory cells including a chalcogenide material, a heater in electrical contact with the chalcogenide material, and an electrode, wherein the memory cell has a cell size of less than 50 nanometers; and
interfacial insulators encasing respective memory cells of the at least two memory cells, an interfacial insulator of the interfacial insulators comprising a first dielectric layer encasing the respective memory cells and a second dielectric layer encasing the first dielectric layer and the respective memory cells.

14. The memory of claim 1, wherein a material of the first dielectric layer is common with a material of the second dielectric layer, wherein the first dielectric layer and the second dielectric layer form at least two continuous layers of the common material.

15. The method of claim 5, wherein a material of the first dielectric layer is common with a material of the second dielectric layers, wherein the first dielectric layer and the second dielectric layer form at least two continuous layers of the common material.

16. The method of claim 5, wherein forming the interfacial insulator further comprises:
depositing the first dielectric layer; and
depositing the second dielectric layer after altering the surface of the first dielectric layer.

17. The method of claim 16, wherein the first and second dielectric layers are formed from a same material, and wherein said altering a surface comprises halting deposition of the same material to form an interface between the first and second dielectric layers.

18. The method of claim 5, wherein said depositing the first dielectric layer, said depositing the second dielectric layer, or both, comprise using atomic layer deposition.

19. The memory of claim 11, wherein a material of the first dielectric layer is common with a material of the second dielectric layers, wherein the first dielectric layer and the second dielectric layer form at least two continuous layers of the common material.

* * * * *

UNITED STATES PATENT AND TRADEMARK OFFICE
CERTIFICATE OF CORRECTION

PATENT NO. : 8,530,874 B1  
APPLICATION NO. : 12/828463  
DATED : September 10, 2013  
INVENTOR(S) : Enrico Varesi Page 1 of 1

It is certified that error appears in the above-identified patent and that said Letters Patent is hereby corrected as shown below:

In the Claims

Column 5, line 31, in Claim 11, delete "at lest" and insert -- at least --, therefor.

Column 6, line 19, in Claim 15, delete "layers," and insert -- layer, --, therefor.

Column 6, line 20, in Claim 15, delete "layers" and insert -- layer --, therefor.

Column 6, line 37, in Claim 19, delete "layers," and insert -- layer, --, therefor.

Signed and Sealed this  
Twenty-sixth Day of November, 2013

Margaret A. Focarino  
*Commissioner for Patents of the United States Patent and Trademark Office*